United States Patent [19]
Kozuka

[11] Patent Number: 6,150,704
[45] Date of Patent: *Nov. 21, 2000

[54] PHOTOELECTRIC CONVERSION APPARATUS AND IMAGE SENSOR

[75] Inventor: Hiraku Kozuka, Hiratsuka, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/164,277

[22] Filed: Oct. 1, 1998

[30] Foreign Application Priority Data

Oct. 6, 1997 [JP] Japan .................................. 9-272577

[51] Int. Cl.$^7$ ............................ H01L 27/14; H01L 31/00
[52] U.S. Cl. .......................................... 257/434; 257/444
[58] Field of Search ..................................... 257/434, 444

[56] References Cited

U.S. PATENT DOCUMENTS

| | | |
|---|---|---|
| 3,860,956 | 1/1975 | Kubo et al. . |
| 4,521,798 | 6/1985 | Baker . |
| 5,510,285 | 4/1996 | Kim ............................................ 437/53 |
| 5,585,653 | 12/1996 | Nakashiba ................................ 257/232 |
| 5,594,236 | 1/1997 | Suzuki et al. . |

FOREIGN PATENT DOCUMENTS

| | | |
|---|---|---|
| 61-075559 | 4/1986 | Japan . |
| 62-002575 | 1/1987 | Japan . |
| 64-089569 | 4/1989 | Japan . |
| 6-104476 | 4/1994 | Japan . |

OTHER PUBLICATIONS

Patent Abstracts of Japan, vol. 018, No. 375 (E–1578), Jul. 14, 1994 (corresponds to JP 06–104476).
Patent Abstracts of Japan, vol. 011, No. 169 (E–511), May 30, 1987 (corresponds to JP 62–002575).
Patent Abstracts of Japan, vol. 014, No. 099 (E–0893), Feb. 22, 1990 (corresponds to JP 01–303752).
Patent Abstracts of Japan, vol. 010, No. 244 (E–430), Aug. 22, 1986 (corresponds to JP 61–075559).
Patent Abstracts of Japan, vol. 013, No. 321 (E–790), Jul. 20, 1989 (corresponds to JP 64–089569).

*Primary Examiner*—Stephen D. Meier
*Attorney, Agent, or Firm*—Fitzpatrick, Cella, Harper & Scinto

[57] ABSTRACT

There are provided a photoelectric conversion apparatus which comprises a light-receiving element including a semiconductor substrate of a first conductivity type, a first semiconductor region of a second conductivity type formed on the surface of the semiconductor substrate, a transparent insulating layer formed on the semiconductor substrate, and a light-shielding layer formed on the insulating layer and having an opening with an area larger than the first semiconductor region, and in which the light-receiving element includes a plurality of first semiconductor regions in a single opening, and the first semiconductor regions in the single opening are electrically connected to each other, and an image sensor using the apparatus.

31 Claims, 12 Drawing Sheets

PHOTOELECTRIC CONVERSION APPARATUS AND IMAGE SENSOR

BACKGROUND OF THE INVENTION

1. Field of the Invention

The present invention relates to a photoelectric conversion apparatus having a light-receiving element formed in a semiconductor substrate, and an image sensor.

2. Related Background Art

In recent years, in the field of linear photoelectric converters, CCDs using a reduction optical system, and equal-magnification image sensors that mount a plurality of semiconductor photosensor chips have been extensively developed.

A light-receiving element in such photoelectric conversion apparatus normally comprises a photodiode formed by a pn junction of semiconductors. For example, as disclosed in Japanese Patent Application Laid-Open No. 55-154784, a structure in which a region having the same conductivity type as that of a substrate and higher impurity concentration than the substrate is formed in a substrate surface portion where no pn junction is formed so as to reduce the dark currents produced on the substrate surface has also been proposed. On the other hand, as a light-receiving element for a linear photoelectric conversion apparatus, various structures such as a structure which reduces the junction capacitance formed by a pn junction, as disclosed in, e.g., Japanese Patent Application Laid-Open No. 61-264758, a structure which reduces the dark currents resulting from the scribed chip edge, as disclosed in Japanese Patent Application Laid-Open No. 1-303752 and so on, have been proposed. A photodiode formed by a pn junction is generally known.

However, when such light-receiving element is applied to an amplifier type photoelectric conversion apparatus which accumulates photocarriers in a pn junction, and reads out a signal voltage using a charge-voltage conversion means, high sensitivity cannot be obtained.

In case of the amplifier type photoelectric conversion apparatus, the light output is given by:

$$Vp = Qp/Cs \qquad (1)$$

where $Qp$ is the amount of charge accumulated on the pn junction, and $Cs$ is the capacitance of the photoelectric conversion portion.

In case of, e.g., an amplifier type photoelectric conversion apparatus comprising a photodiode, MOS source-follower circuit, and reset MOS circuit, the capacitance $Cs$ of the photoelectric conversion portion is given by:

$$Cs = Cpd + Ca \qquad (2)$$

where $Cpd$ is the pn junction capacitance of a pn photodiode, and $Ca$ is another capacitance connected to the photoelectric conversion portion, which capacitance includes the gate capacitance of a MOS transistor which forms the MOS source-follower circuit, and the source/well junction capacitance, source/gate overlapping capacitance, wiring capacitance, and the like of a MOS transistor that forms the reset MOS transistor.

Hence, in order to realize high sensitivity, photocarriers must be effectively accumulated, and the capacitance of the photoelectric conversion portion where the photocarriers are accumulated must be minimized.

However, in a contact image sensor which uses a photodiode obtained by forming in a semiconductor substrate a region having a conductivity type opposite to that of the semiconductor substrate, since the pixel pitch at a resolution of, e.g., 300 dpi is around 84.7 microns, a pn junction having an area nearly equal to the opening is required to effectively read out photocarriers, but then the pn junction capacitance $Cpd$ of the photodiode portion in equation (2) increases.

On the other hand, when the pn junction area is decreased to reduce the pn junction capacitance $Cpd$ of the photodiode portion, photocarriers accumulated on the pn junction region decrease.

Japanese Patent Application Laid-Open No. 61-264758 discloses a technique for forming an accumulation portion having an annular shape or partially cutaway annular shape so as to reduce the junction capacitance of the accumulation region.

However, when a region having the same conductivity type as that of the substrate and higher impurity concentration than that of the substrate is formed in the substrate surface for the purpose of suppressing the dark currents produced on the substrate surface, as disclosed in Japanese Patent Application Laid-Open No. 55-154784, the depletion layer narrows down around the junction, and the circumferential length dependence of the pn junction capacitance increases, as shown in FIG. 2 of Japanese Patent Application Laid-Open No. 55-154784.

Hence, the structure disclosed in Japanese Patent Application Laid-Open No. 61-264758 can hardly attain high sensitivity, since the capacitance value of the pn junction cannot be sufficiently reduced due to an increase in circumferential length although the pn junction area decreases.

On the other hand, along with development of recent micropatterning techniques of semiconductor elements, a technique that uses Ti, TiN, or the like as a barrier metal, i.e., a wiring material that contacts a semiconductor diffusion layer is normally used.

Hence, in order to obtain a satisfactory ohmic contact with a p-type diffusion layer, the impurity concentration of the semiconductor diffusion layer must be higher than that when Al is used as a wiring material.

However, in the prior art, when the impurity concentration of a p-type region of the photodiode portion is increased, the dark currents increase and they also vary to a large extent.

These dark currents are probably produced by an increase in crystal defects present in a depletion layer as a result of an increase in impurity concentration of the p-type layer in the junction between p- and n-type regions, and the junction between p- and n-type regions formed to suppress dark currents at a semiconductor/oxide layer interface, or are probably produced by a high electric field locally produced in the vicinity of the junction.

When the impurity concentration of the p-type region is decreased to suppress the dark currents, the contact resistance in the p-type region increases, and its variation also becomes large, resulting in larger characteristics variations of photoelectric conversion apparatuses.

That is, upon application of a general micropatterning technique to the prior art, problems of increases in dark current and variations of dark currents are posed.

SUMMARY OF THE INVENTION

It is an object of the present invention to provide a photoelectric conversion apparatus having a high-sensitivity light-receiving portion, and an image sensor.

It is another object of the present invention to provide a photoelectric conversion apparatus which can reduce dark currents, and an image sensor.

In order to achieve the above objects, according to the present invention, there is provided a photoelectric conversion apparatus comprising a light-receiving element having a semiconductor substrate of a first conductivity type, a first semiconductor region of a second conductivity type, formed on a surface of the semiconductor substrate, a transparent insulating layer formed on the semiconductor substrate, and a light-shielding layer formed on the insulating layer and having an opening with an area larger than the first semiconductor region, wherein the light-receiving element has a plurality of first semiconductor regions equivalent to the first semiconductor region in a single opening, and the plurality of first semiconductor regions in the single opening are electrically connected to each other.

Also, according to the present invention, there is provided an image sensor formed by mounting on a circuit board a plurality of photoelectric conversion, wherein each of the plurality of photoelectric conversion apparatuses includes a light-receiving element having a semiconductor substrate of a first conductivity type, a first semiconductor region of a second conductivity type, formed on a surface of the semiconductor substrate, a transparent insulating layer formed on the semiconductor substrate, and a light-shielding layer formed on the insulating layer and having an opening with an area larger than the first semiconductor region, and wherein the light-receiving element has a plurality of first semiconductor regions equivalent to the first semiconductor region in a single opening, and the plurality of first semiconductor regions in the single opening are electrically connected to each other.

Furthermore, according to the present invention, there is provided a photoelectric conversion apparatus comprising a light-receiving element having a first semiconductor region of a first conductivity type, a second semiconductor region of a second conductivity type, formed on a surface of the first semiconductor region, a third semiconductor region of the second conductivity type, which is formed in the second semiconductor region and has an impurity concentration higher than the second semiconductor region, a first conductive material electrically connected to the third semiconductor region, a transparent insulating layer formed on the first conductive material, and a light-shielding layer formed on the insulating layer and having an opening with an area larger than the second semiconductor region.

Moreover, according to the present invention, there is provided an image sensor formed by mounting on a circuit board a plurality of photoelectric conversion apparatuses, wherein each of the plurality of photoelectric conversion apparatuses includes a light-receiving element having a first semiconductor region of a first conductivity type, a second semiconductor region of a second conductivity type, formed on a surface of the first semiconductor region, a third semiconductor region of the second conductivity type, which is formed in the second semiconductor region and has an impurity concentration higher than the second semiconductor region, a first conductive material electrically connected to the third semiconductor region, a transparent insulating layer formed on the first conductive material, and a light-shielding layer formed on the insulating layer and having an opening with an area larger than the second semiconductor region.

With the above arrangement, a high-quality image can be obtained.

DESCRIPTION OF THE PREFERRED EMBODIMENTS

Figure 1:
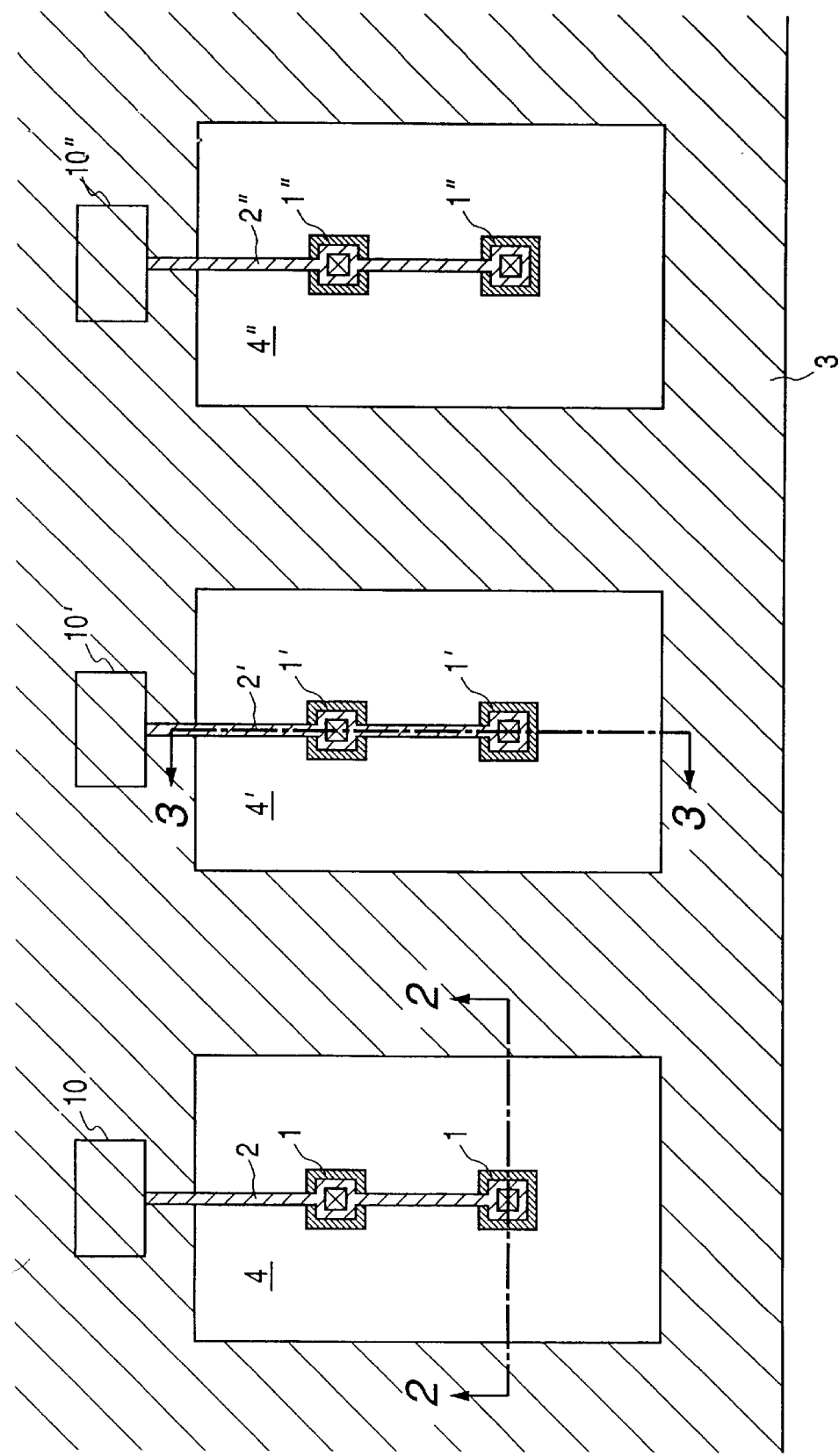
FIG. 1 is a schematic plan view showing the structure of a light-receiving portion of a photoelectric conversion apparatus according to the first embodiment of the present invention.
Figure 2:
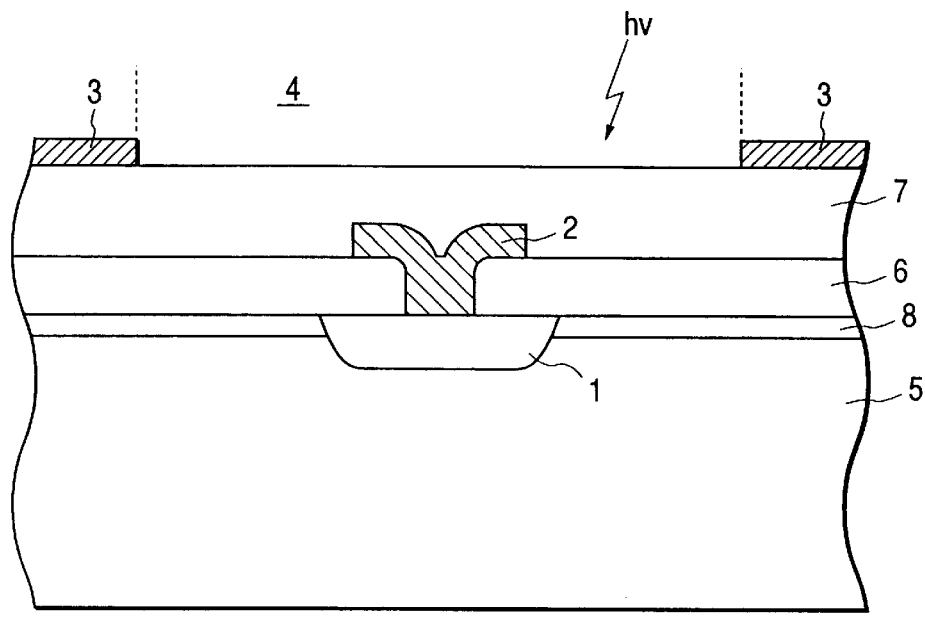
FIG. 2 is a schematic sectional view showing the structure taken along a line 2—2 in FIG. 1.
Figure 3:
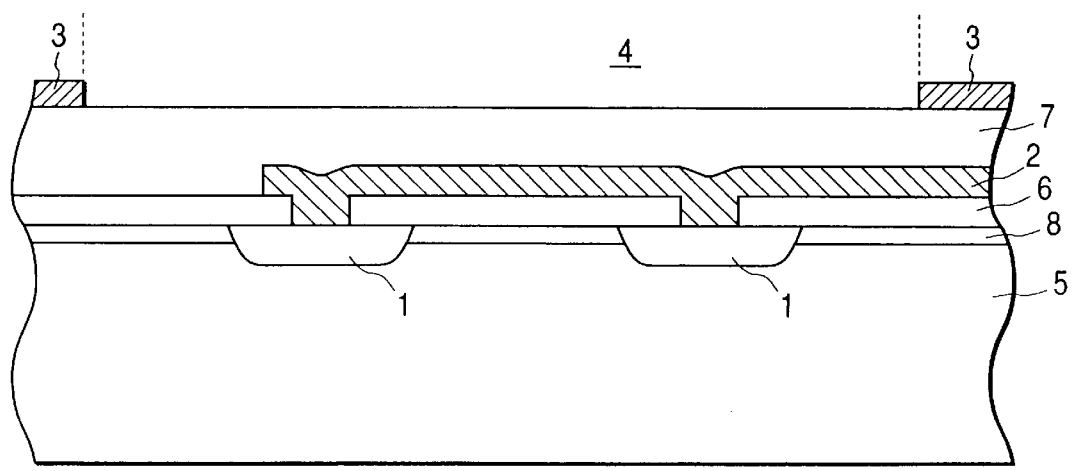
FIG. 3 is a schematic sectional view showing the structure taken along a line 3—3 in FIG. 1.

FIG. 1 is a schematic plan view showing the structure of a light-receiving portion of a photoelectric conversion apparatus according to the first embodiment of the present invention, FIG. 2 is a schematic sectional view showing the structure taken along a line 2—2 in FIG. 1, and FIG. 3 is a schematic sectional view showing the structure taken along a line 3—3 in FIG. 1.

An embodiment of the present invention will be described below taking as an example of an n-type semiconductor substrate. However, the present invention is not limited to an n-type semiconductor substrate, and can obtain the same effects even when a p-type semiconductor substrate is used.

Referring to FIG. 1, openings 4, 4', and 4" are formed in a light-shielding layer 3 to form a light-receiving array. Inside the openings 4, 4', and 4", two each p-type regions 1, 1', and 1" are respectively formed on the surface of an n-type semiconductor substrate 5 to form pn junctions with the n-type semiconductor substrate. A plurality of p-type regions are formed in the single opening, and are connected to each other via an interconnect 2.

Charge-voltage conversion means 10, 10', and 10" respectively convert charge signals based on photocarriers, which are produced in the n-type semiconductor substrate 5 and are accumulated in the p-type regions 1, 1', and 1", into voltage signals. For example, a MOS amplifier or MOS source-follower circuit using MOS transistors is suitably used, and photocharges are converted into voltage signals via these circuits.

Referring to FIGS. 2 and 3, an n-type semiconductor region 8 having a higher concentration than the substrate is formed on the surface of the n-type semiconductor substrate 5, and transparent insulating layers 6 and 7 are formed between the n-type semiconductor substrate 5 and interconnect 2, and between the interconnect 2 and light-shielding layer 3.

In the present invention, an n-type semiconductor substrate 5 having an impurity concentration of around $10^{14}$ to $10^{17}$ cm$^{-3}$ can be used. Preferably, the substrate 5 has an impurity concentration of around $10^{14}$ to $10^{16}$ cm$^{-3}$.

Each p-type region 1 preferably has an impurity concentration of around $10^{18}$ to $10^{22}$ cm$^{-3}$. In FIGS. 1, 2, and 3, each p-type region is formed to be broader than the interconnect region but may be smaller than the interconnect region. Furthermore, in FIGS. 1, 2, and 3, each p-type region is formed into a rectangular shape. Alternatively, in order to reduce the circumferential length, each p-type region may be formed into a circular shape or regions having different shapes and sizes may be formed.

The n-type region 8 is formed on the surface of the n-type semiconductor substrate 5 to reduce the dark currents produced in the vicinity of the interface between the substrate 5 and insulating layer 6, and need only have an impurity concentration of about $10^{16}$ to $10^{18}$ cm$^{-3}$ in its surface portion. The n-type region may be formed with an offset not to directly contact each p-type region, or may be formed on the entire surface without any offset when it has an impurity concentration lower than that of the p-type region.

As for the transparent insulating layer 6 and 7 and interconnect 2, materials used in a normal silicon process may be applied to the present invention.

The light-shield layer 3 may consist of a metal which also serves as an interconnect, or may be formed of other organic materials or inorganic materials. Each opening 4 formed by partially removing this light-shielding layer has a size of around 80×50 μm as one area region in case of a contact image sensor having an optical resolution of 300 dpi or equivalent.

Figure 4:
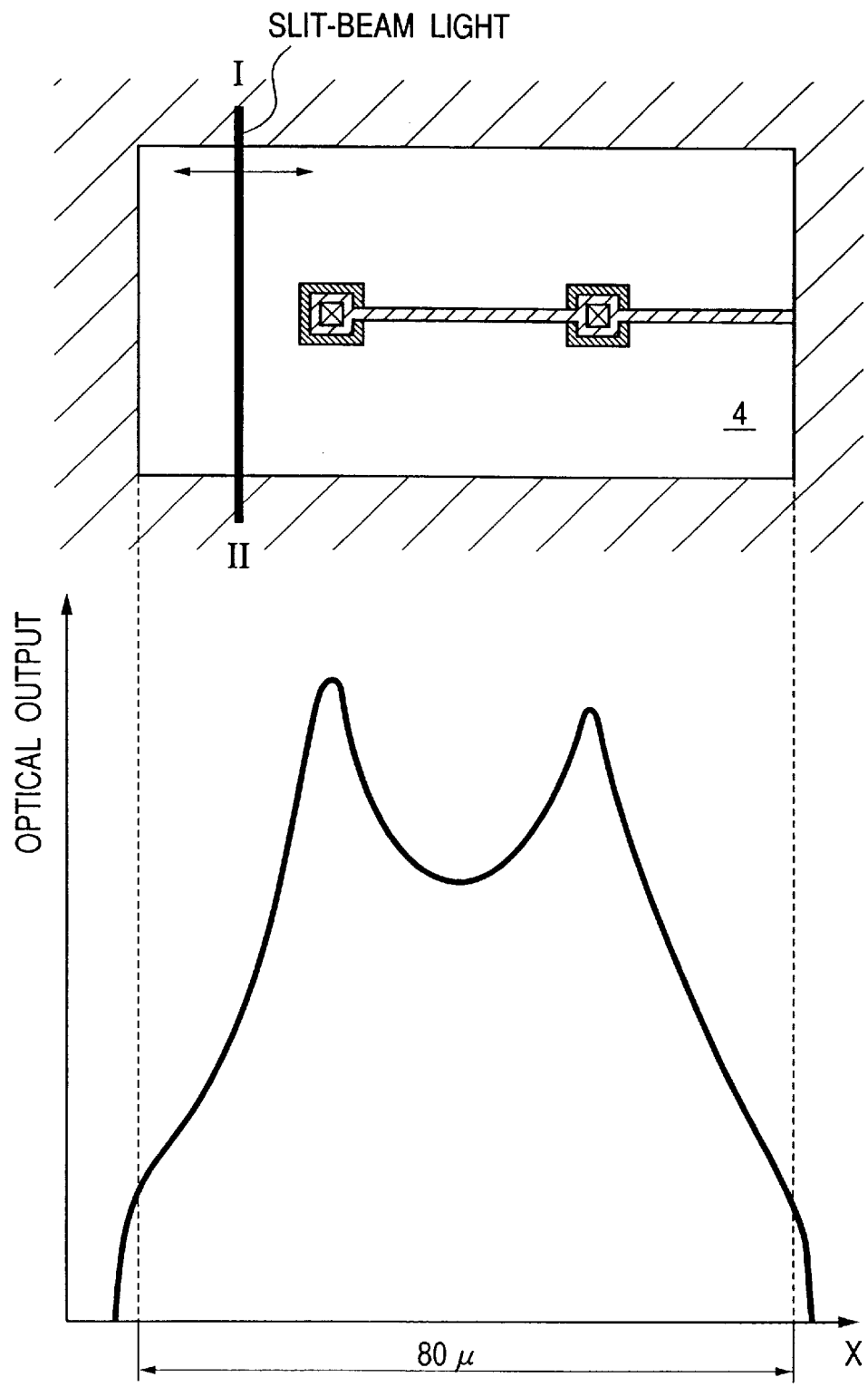
FIG. 4 is a view showing the light sensitivity distribution in an opening.

The effects of the present invention will be explained below with reference to FIG. 4. FIG. 4 shows the output obtained by irradiating a portion I-II in FIG. 4 with slit-beam light, and scanning the opening 4 in the horizontal direction, i.e., the light sensitivity distribution in the opening 4 in the horizontal direction. As can be seen from FIG. 4, in the present invention, the photocarriers produced in a depletion layer portion of the pn junction are effectively accumulated on each p-type region, but the photocarriers produced in the neutral region in the substrate are virtually isotopically scattered and recombine, thus decreasing the optical output with increasing distance from the p-type region. In this way, since the optical outputs at the two p-type regions 1 in the opening 4 are high, a high optical output level can be assured when a plurality of p-type regions are formed.

Hence, since a plurality of p-type regions are formed in each opening 4, the sum total of the circumferential lengths of the p-type region can be minimized, and the photocarriers produced in the opening can be effectively accumulated.

Figure 5:
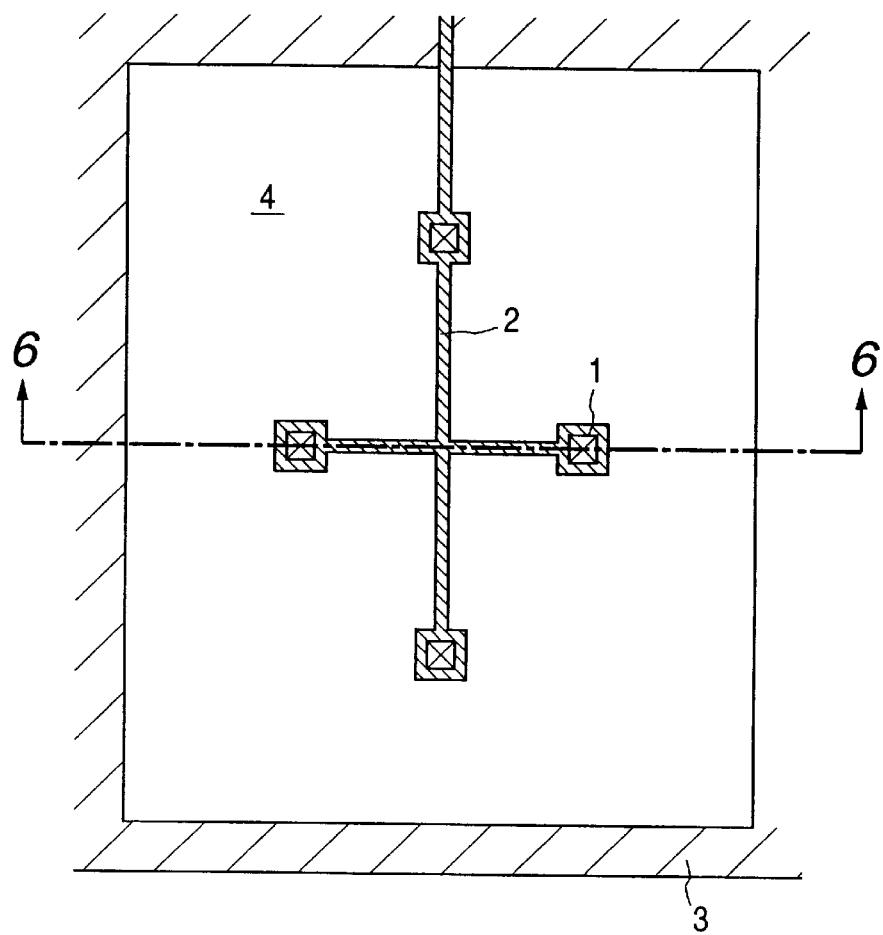
FIG. 5 is a plan view showing the structure for one pixel according to the second embodiment of the present invention.
Figure 6:
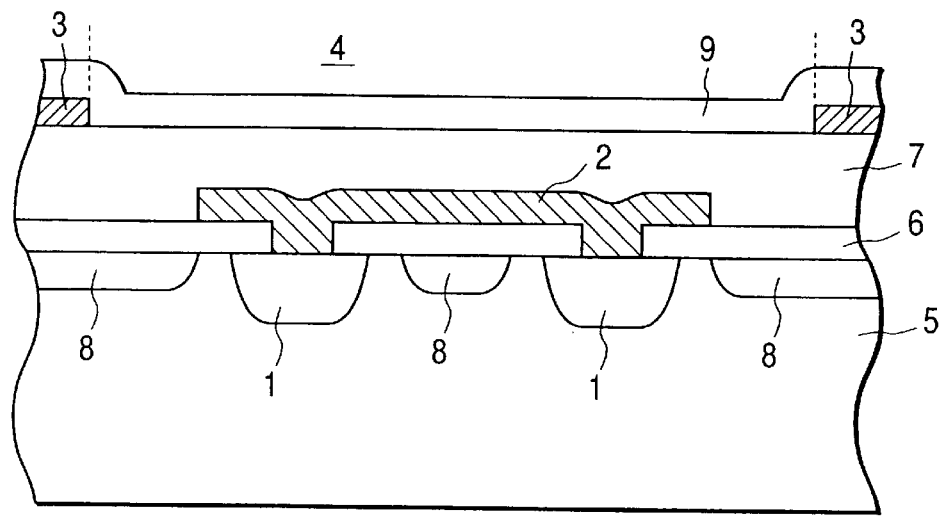
FIG. 6 is a sectional view showing the structure taken along a line 6—6 in FIG. 5 of the present invention.
Figure 7:
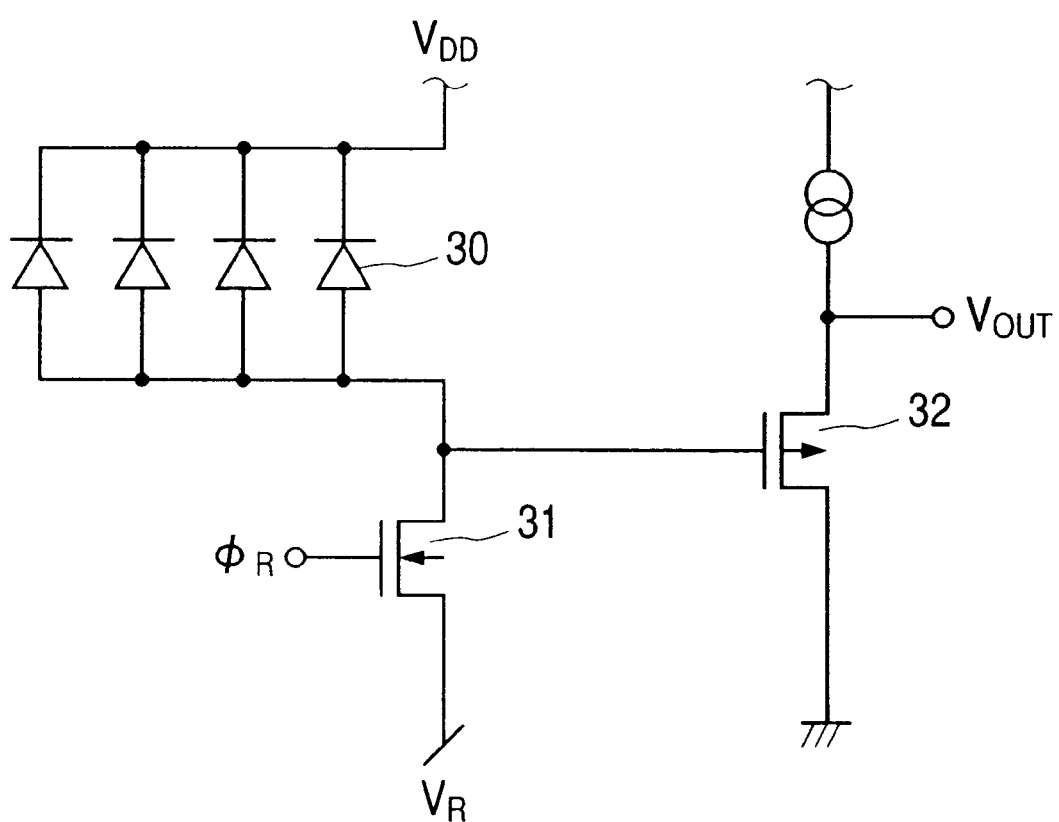
FIG. 7 is an equivalent circuit diagram for one pixel in the second embodiment of the present invention.

FIG. 5 is a plan view showing the structure for one pixel in the second embodiment of the present invention, FIG. 6 is a sectional view showing the structure taken along a line 6—6 in FIG. 5, and FIG. 7 is the equivalent circuit diagram for one pixel in FIG. 5.

In this embodiment, four pn functions are formed in each opening 4. Four p-type regions 1 having a sheet resistance of 280 Ω are formed on the surface of an n-type semiconductor substrate having a resistivity of 1 Ω·cm to respectively form pn junctions. An n-type region 8 is formed on the surface of the substrate 5 to have an offset from each p-type region. The surface concentration of this n-type region 8 is approximately $5\times10^{16}$ cm$^{-3}$. An interconnect 2 and light-shielding layer 3 are formed of Al. A transparent insulating layer 6 has a two-layered structure of SiO$_2$ and BPSG (BoroPhosphoSilicate Glass: silica glass containing boron and phosphorus), and a transparent insulating layer 7 uses an SiO layer. An SiN layer is formed as a protection layer 9 on the light-shielding layer 3.

Referring to FIG. 7, in this embodiment, four photodiodes 30 each serving as a light-receiving element are formed per pixel. One photodiode 30 corresponds to one pn junction in FIG. 6. The p-type region 1 of the photodiode 30 is connected to a reset NMOS transistor 31 and the input node of a PMOS source-follower transistor 32, and its output is charge-voltage-converted to obtain an output signal V$_{out}$.

Eleven sensor chips each of which had a pixel pitch of 84.7 μm and 234 pixels each having the above arrangement, were mounted on a glass epoxy substrate to form a 21.8-cm wide, A4-size contact image sensor. Note that upon forming a contact image sensor by lining up a plurality of chips, the pitch of the junctions between neighboring chips could be nearly equal to the pixel pitch by reducing the size of each opening to be smaller than the image reading resolution pitch. More specifically, the pixel pitch for 300 dpi was set at about 82.5 μm, and the opening pitch was set at about 50.0 μm. With this structure, the same resolution as that in the chip can be obtained even at the junction. The same applies to the following embodiments.

Upon sensitivity comparison between this embodiment and the prior art which is optimized by placing p-type regions in an annular pattern to maximize the sensitivity, the sensitivity of this embodiment was approximately 1.3 times that of the prior art.

In the first or second embodiment described above, an n-type semiconductor region 8 having a higher concentration than that of the substrate is formed on the n-type semiconductor substrate 5, but is not always required. However, by forming the n-type semiconductor region 8, dark currents can be reduced.

Figure 8:
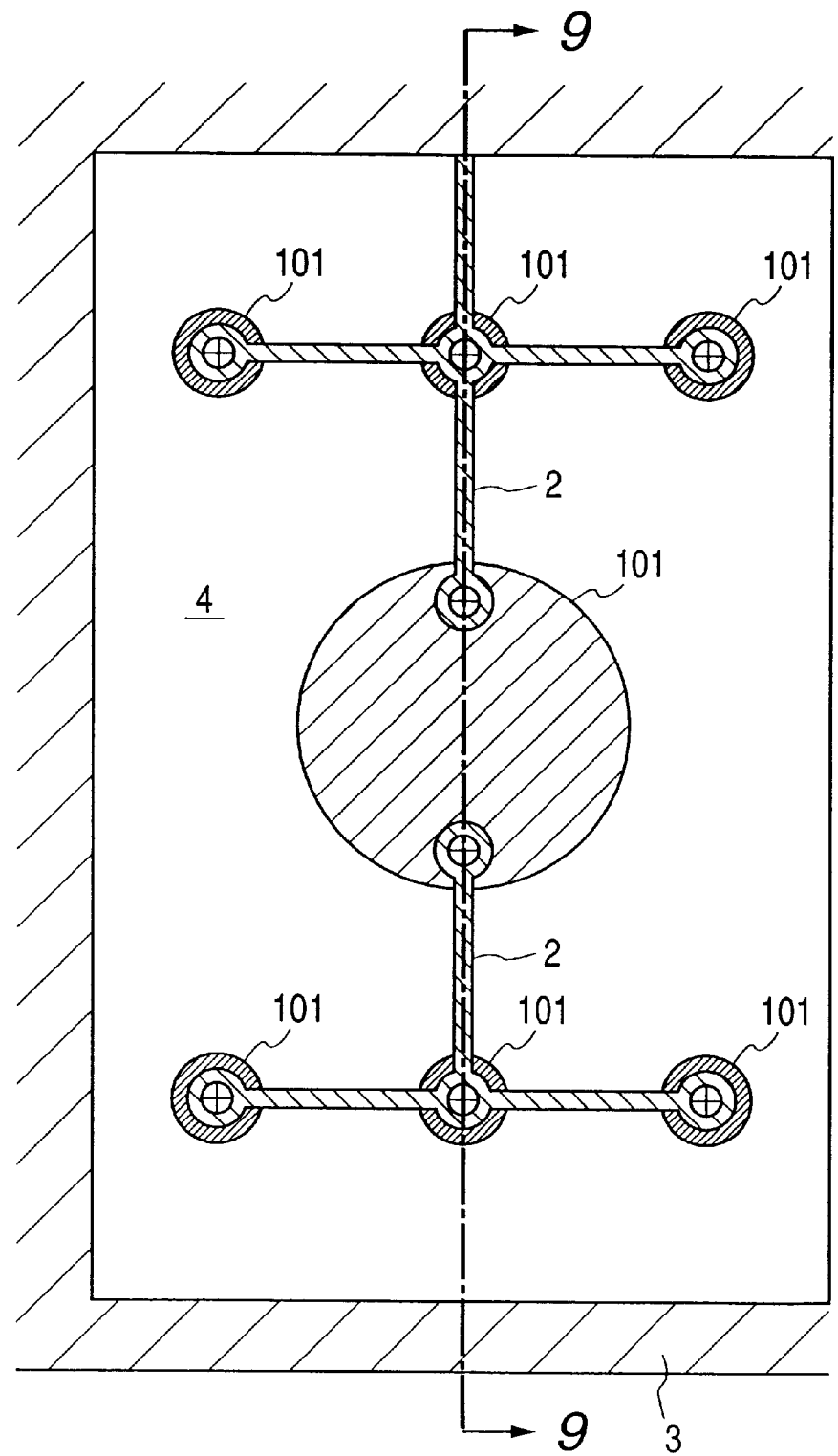
FIG. 8 is a plan view showing the structure for one pixel according to the third embodiment of the present invention.
Figure 9:
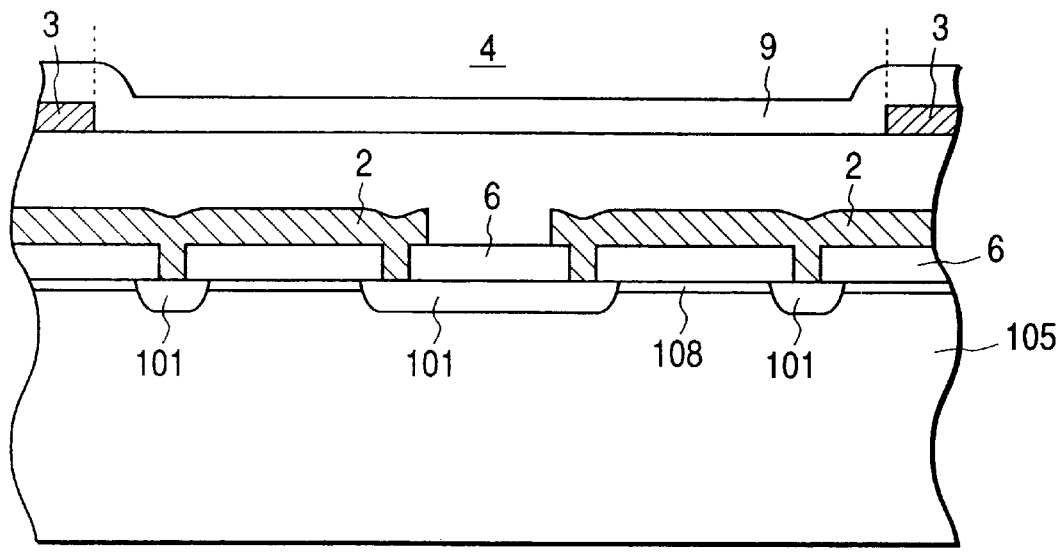
FIG. 9 is a sectional view showing the structure taken along a line 9—9 in FIG. 8.
Figure 10:
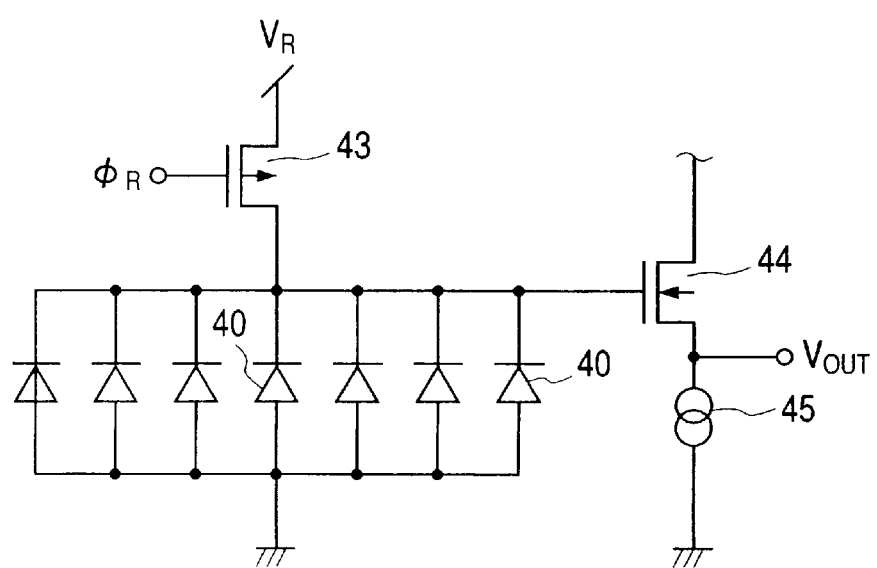
FIG. 10 is an equivalent circuit diagram for one pixel in the third embodiment of the present invention.

FIG. 8 is a plan view showing the structure for one pixel according to the third embodiment of the present invention, FIG. 9 is a sectional view showing the structure taken along a line 9—9 in FIG. 8, and FIG. 10 is the equivalent circuit diagram for one pixel.

In this embodiment, each opening 4 includes seven, circular pn junctions having different sizes.

Seven n-type regions 101 are formed on the surface of a p-type semiconductor substrate 105 having a resistivity of 10 Ω·cm to form pn junctions. Also, a p-type region 108 is formed on the entire surface of the substrate 105, except for the n-type regions 101. The surface concentration of this p-type region is around $1\times10^{17}$ cm$^{-3}$.

An interconnect 2 and light-shielding layer 3 are formed of Al. A transparent insulating layer 6 has a two-layered structure of SiO$_2$ and BPSG, and a transparent insulating layer 7 uses an SiO layer. An SiN layer is formed as a protection layer 9 on the light-shielding layer 3.

Referring to FIG. 10, in this embodiment, seven photodiodes 40 serving as light-receiving elements are formed per pixel. One photodiode 40 corresponds to one pn junction in FIG. 8. The n-type region of the photodiode 40 is connected to a reset PMOS transistor 43 and the input node of an NMOS source-follower transistor 44. The PMOS transistor 43 is turned on to reset any residual charges on the photodiode 40, and after that, photocharges corresponding to the amount of image light are accumulated for a predetermined period of time. Then, the NMOS transistor 44 is turned on to make charge-voltage conversion, thereby obtaining an output signal $V_{out}$ using a constant current circuit as a load in terms of the operation of the NMOS transistor 44.

Eleven sensor chips each of which had a pixel pitch of 127 $\mu$m and 158 pixels each having the above arrangement, were mounted on a glass epoxy substrate to form a 22-cm wide, A4-size contact image sensor.

In the third embodiment described above, a p-type semiconductor region 108 having a higher concentration than that of the substrate is formed on the p-type semiconductor substrate 105, but is not always required. However, by forming the p-type semiconductor region 108, dark currents can be reduced.

Figure 11:
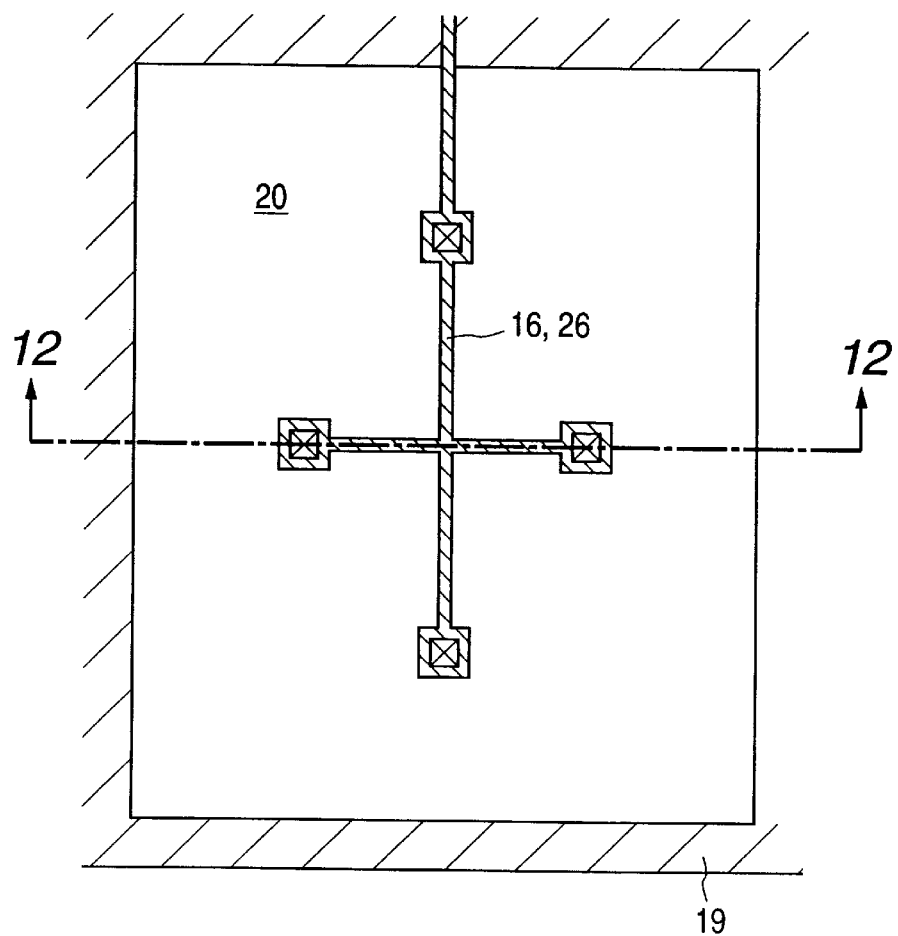
FIG. 11 is a plan view showing the structure for one pixel according to the fourth embodiment of the present invention.
Figure 12:
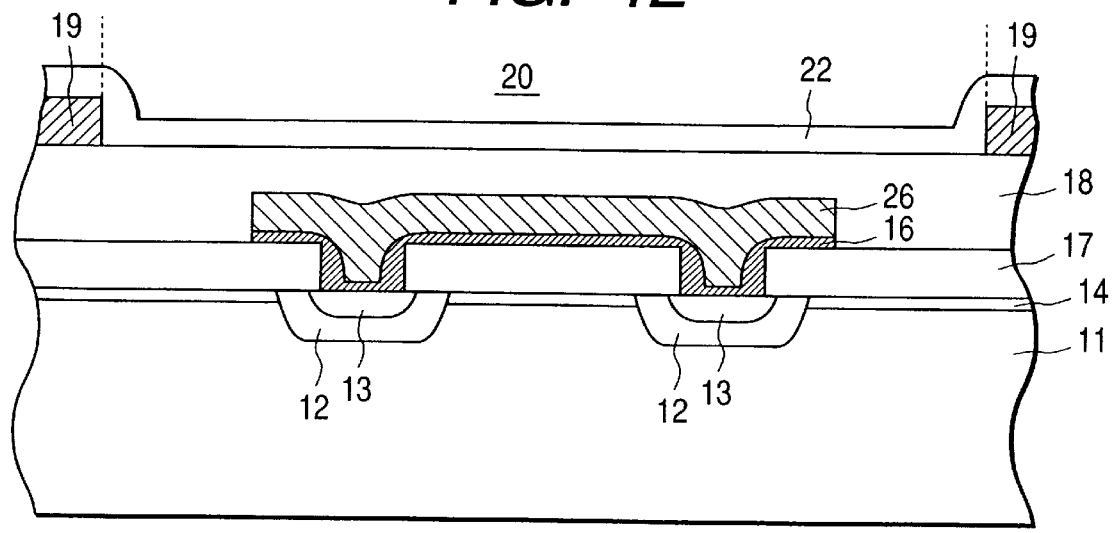
FIG. 12 is a sectional view showing the structure taken along a line 12—12 in FIG. 11 of the present invention.

FIG. 11 is a plan view showing the structure for one pixel according to the fourth embodiment of the present invention, and FIG. 12 is a sectional view showing the structure taken along a line 12—12 in FIG. 11.

This embodiment adopts a pixel arrangement in which four pn functions are formed in each opening to improve collection efficiency of photocarriers.

A first p-type region 12 having a sheet resistance of about 1,000 Ω is formed on the surface of an n-type semiconductor substrate 11 having a resistivity of 8 Ω·cm to form a pn junction between the n-type semiconductor substrate 11 and first p-type region 12.

Also, a second p-type region 13 having a sheet resistance of about 70 Ω is formed in the first p-type region 12.

Furthermore, a first n-type region 14 is formed on the surface of the substrate 11. The surface concentration of this n-type region 14 is approximately $8 \times 10^{16}$ cm$^{-3}$.

A metal interconnect to be connected to the second p-type region has a two-layered structure of a TiN layer 15 and Al layer 26, and electrically connects four island-like pn junction regions formed in the pixel.

A transparent insulating layer 17 has a two-layered structure of $SiO_2$ and BPSG, and a transparent insulating layer 18 uses an SiO layer. A light-shielding layer 19 is formed of Al. An SiN layer is formed as a protection layer 22 on the light-shielding layer 19.

In this embodiment, in order to improve collection efficiency of photocarriers which are produced in a neutral region in the substrate and are isotopically scattered, a plurality of small pn junctions are formed in the pixel.

Eleven sensor chips each of which had a pixel pitch of 84.7 $\mu$m and 234 pixels each having the above arrangement, were mounted on a glass epoxy substrate to form a photoelectric conversion apparatus that builds an A4-size contact image sensor.

Upon comparison of dark currents between this embodiment and the prior art having no first p-type region 12 as the characteristic feature of the present invention in this embodiment, the dark currents of the present invention were approximately 1/10 those of the prior art.

In the above embodiment, photoelectric conversion pixels have been exemplified. Photocharges obtained by an efficient pixel in a planar area are charge-voltage-converted by, e.g., a source-follower circuit having a MOS structure to read out a voltage onto an output line, and the difference between the output voltage and dark currents is calculated. Then, the difference signal is subjected to shading correction, gamma correction, and the like, and the corrected signal is output as an image signal.

In the fourth embodiment, an n-type semiconductor region 14 having a higher concentration than that of the substrate is formed on the n-type semiconductor substrate 11, but is not always required. However, by forming the n-type semiconductor region 14, dark currents can be reduced.

Figure 13:
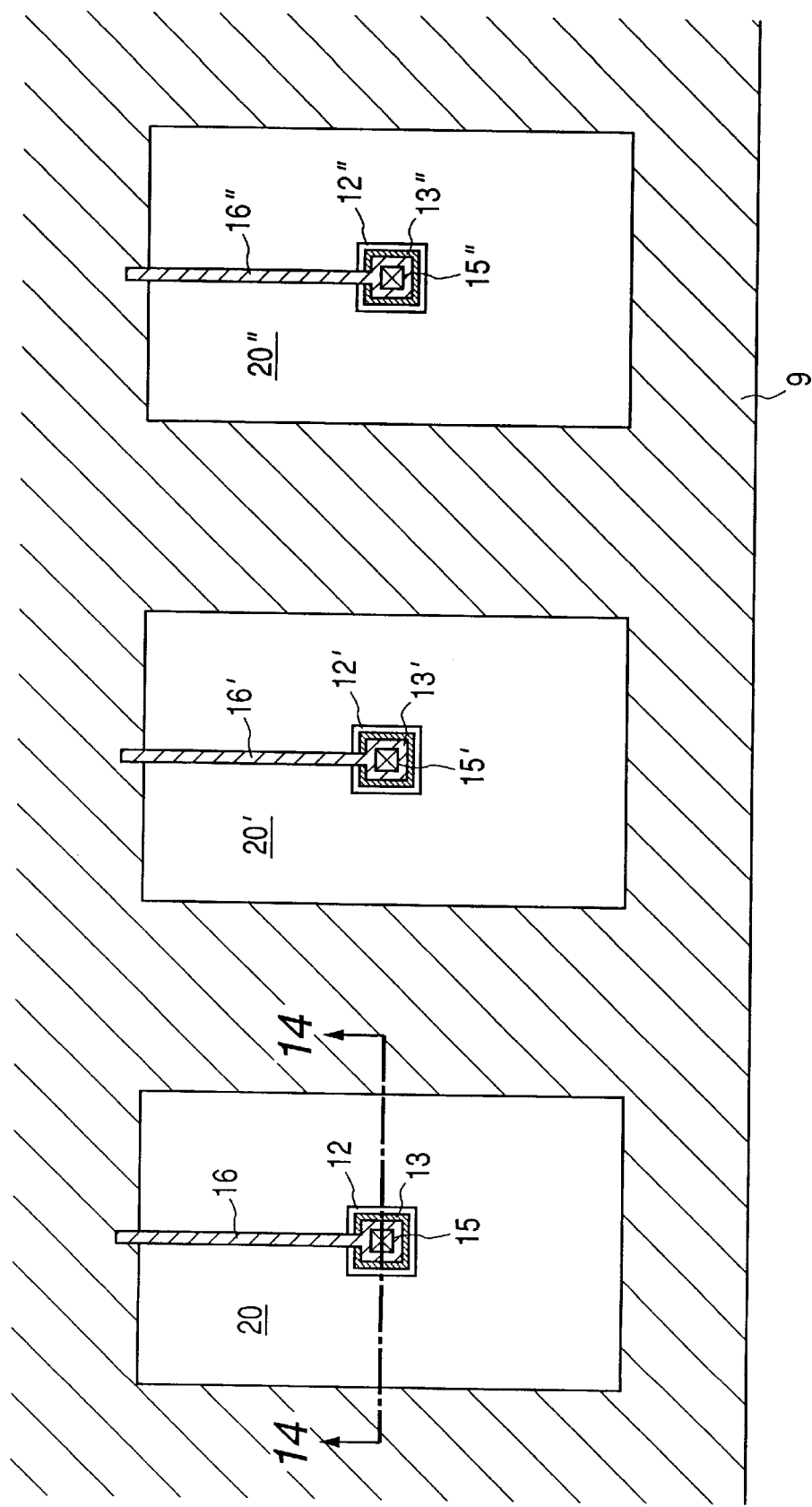
FIG. 13 is a plan view showing the structure of a light-receiving portion of a photoelectric conversion apparatus according to the fifth embodiment of the present invention.
Figure 14:
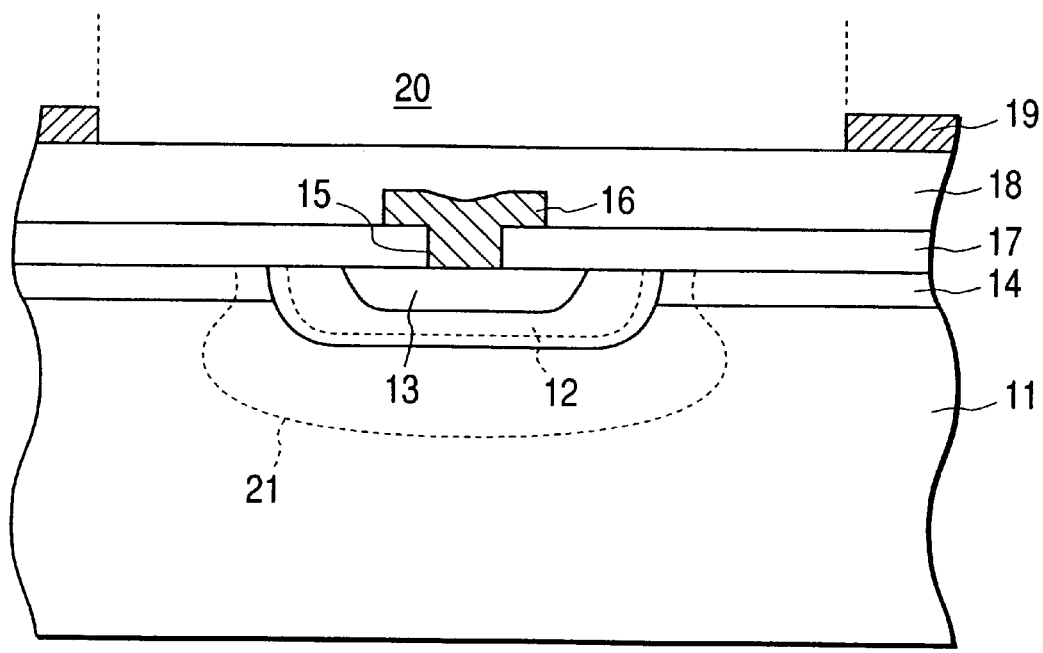
FIG. 14 is a sectional view showing the structure taken along a line 14—14 in FIG. 13 of the present invention.

FIG. 13 is a schematic plan view showing the structure of a light-receiving portion of a photoelectric conversion apparatus according to the fifth embodiment of the present invention, and FIG. 14 is a schematic sectional view showing the structure taken along a line 14—14 in FIG. 13.

In FIGS. 13 and 14, first p-type regions 12, 12', and 12" are formed as second semiconductor regions on the surface of an n-type semiconductor substrate 11 serving as a first semiconductor region to form light-receiving elements as pn junctions together with the n-type semiconductor substrate 11.

Also, second p-type regions 13, 13', and 13" having an impurity concentration higher than that of the first p-type regions are formed as third semiconductor regions in the first p-type regions 12, 12', and 12", and are electrically connected to metal interconnect regions 16, 16', and 16" via ohmic contacts (contact holes) 15, 15', and 15".

Furthermore, a first n-type region 14 having an impurity concentration higher than that of the n-type semiconductor substrate 11 is formed on the n-type semiconductor substrate 11.

On the other hand, a first transparent insulating layer 17 is formed on the n-type semiconductor substrate 11 via the first n-type region 14, and the metal interconnect regions 16, 16', and 16" are connected to the second p-type regions 13, 13', and 13" via the contact holes 15, 15', and 15" smaller than the second p-type regions 13, 13', and 13".

Moreover, a second transparent insulating layer 18 is formed on the first insulating layer 17 and metal interconnect regions 16, 16', and 16", and a light-shielding layer 19 having openings 20, 20', and 20" larger than the first p-type regions 12, 12', and 12" are formed on the second insulating layer 18.

In the arrangement of the present invention, the dotted line 21 in FIG. 14 indicates depletion upon application of a reverse bias to the pn junction.

In the present invention, as the first semiconductor region, the n-type semiconductor substrate 11, an epitaxial layer grown on the n-type semiconductor substrate, or a structure having a high-concentration buried layer between the n-type semiconductor substrate 11 and epitaxial layer may be used. In order to obtain effects of improving collection efficiency of photocarriers and decreasing the junction capacitance by broadening the depletion layer 21 of the pn junction, the impurity concentration in the vicinity of the surface of the first semiconductor region 11 is preferably set at around $10^{14}$ to $10^{17}$ cm$^{-3}$ and, more preferably, at around $10^{14}$ to $10^{16}$ cm$^{-3}$.

Each first p-type region 12 forms a pn junction between the n-type semiconductor substrate 11 and first n-type region 14. The first p-type region 12 is preferably formed to minimize defects in the depletion layer region of the pn junction and to prevent any excessive electric field. More specifically, the impurity concentration of the first p-type region 12 is set at around $10^{17}$ to $10^{19}$ cm$^{-3}$, and is formed in a thermal process that can sufficiently activate the impurity.

Each second p-type region 13 is formed to have a concentration as relatively high as around $10^{19}$ to $10^{20}$ cm$^{-3}$ so as to obtain a satisfactory ohmic contact with the metal interconnect region 16 used for reading photocarriers. Note that the second p-type region 13 is formed inside the first p-type region 12 so as to prevent the depletion layer from extending to the second p-type region, thus suppressing dark currents.

The first n-type region 14 is formed to suppress the dark currents produced at an interface between the n-type semiconductor substrate 11 and first insulating layer 17, and preferably has an impurity concentration that can prevent the region from being depleted in the vicinity of the interface and can reduce defects in the junction with the first p-type region 12, more specifically, around $10^{16}$ to $10^{18}$ cm$^{-3}$.

The first n-type region 14 may be formed with an offset so as not to directly contact the first p-type region 12. However, when the region 14 has a sufficiently lower impurity concentration than that of the first p-type region 12, the region 14 is preferably formed on the entire surface without using any offset so as to enhance the effect of reducing dark currents produced from the interface between the semiconductor substrate 11 and first insulating layer 17.

The metal interconnect region 16 can use a material used as a barrier metal in a normal silicon process: more specifically, high-melting point metals such as Ti, W, Pt, Mo, Hf, Co, and the like, and compounds containing them as major components. In FIGS. 11 and 12, a metal interconnect region has a single-layered structure, but may have a two-layered wiring structure of the barrier metal and Al, or a wiring multilayer including three or more layers.

As the transparent insulating layers 17 and 8, SiO$_2$, SiO, SiN, and the like as materials used in a conventional silicon process can be applied to the present invention.

The light-shielding layer 19 may also serve as an interconnect by using a metal, or may use other organic materials, or inorganic materials. Each opening 20 formed by partially removing the light-shielding layer 19 has a size of around 80×50 µm in case of a contact image sensor having an optical resolution of 300 dpi or equivalence.

Also, the present invention can obtain the same effect in case of a p-type semiconductor substrate, which has a conductivity type opposite to that in this embodiment. However, in view of compatibility with a normal silicon process, the obtained effect is more conspicuous when the first semiconductor region has n conductivity type.

Figure 15:
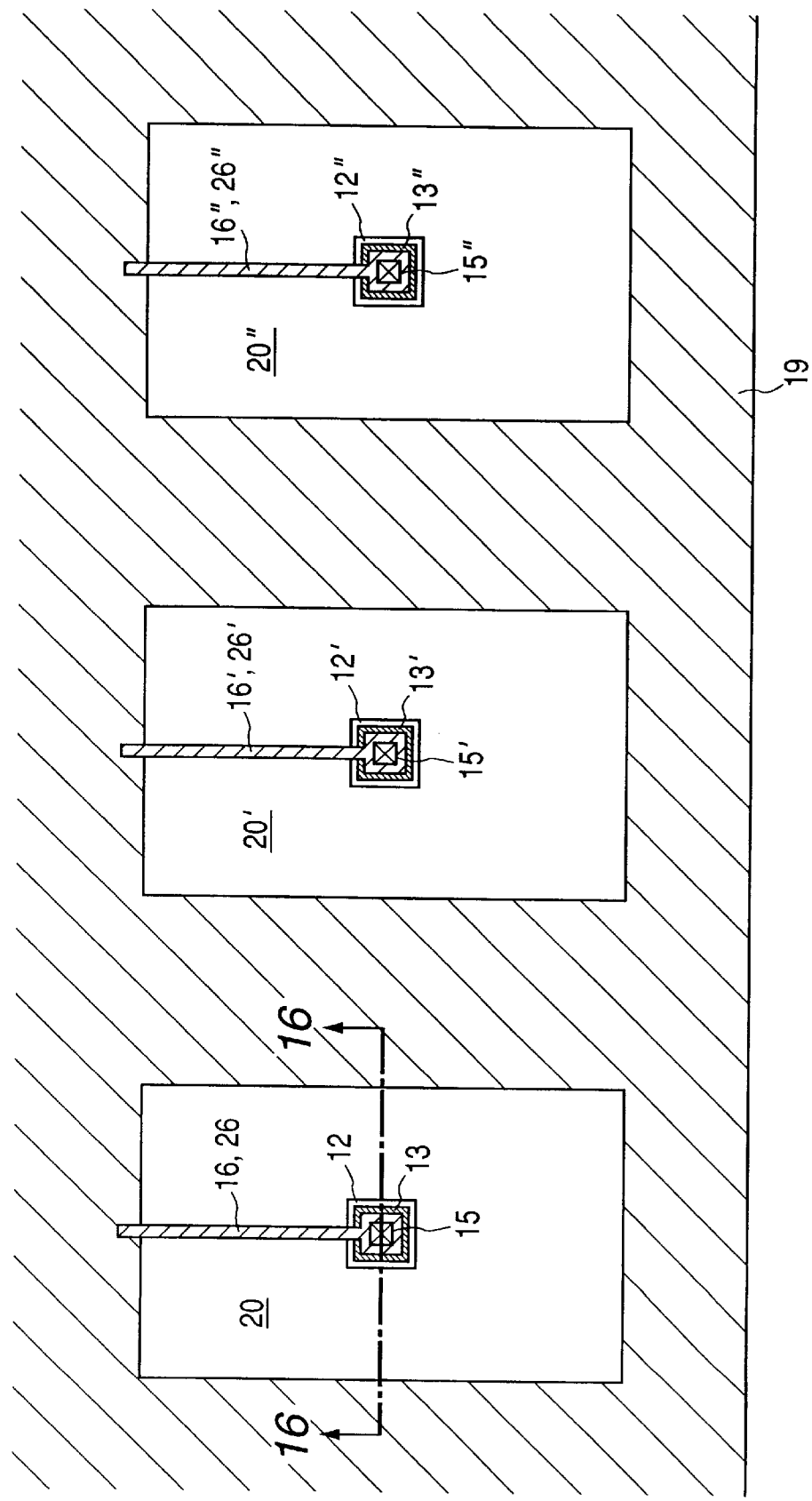
FIG. 15 is a plan view showing the structure of a pixel portion according to the sixth embodiment of the present invention.
Figure 16:
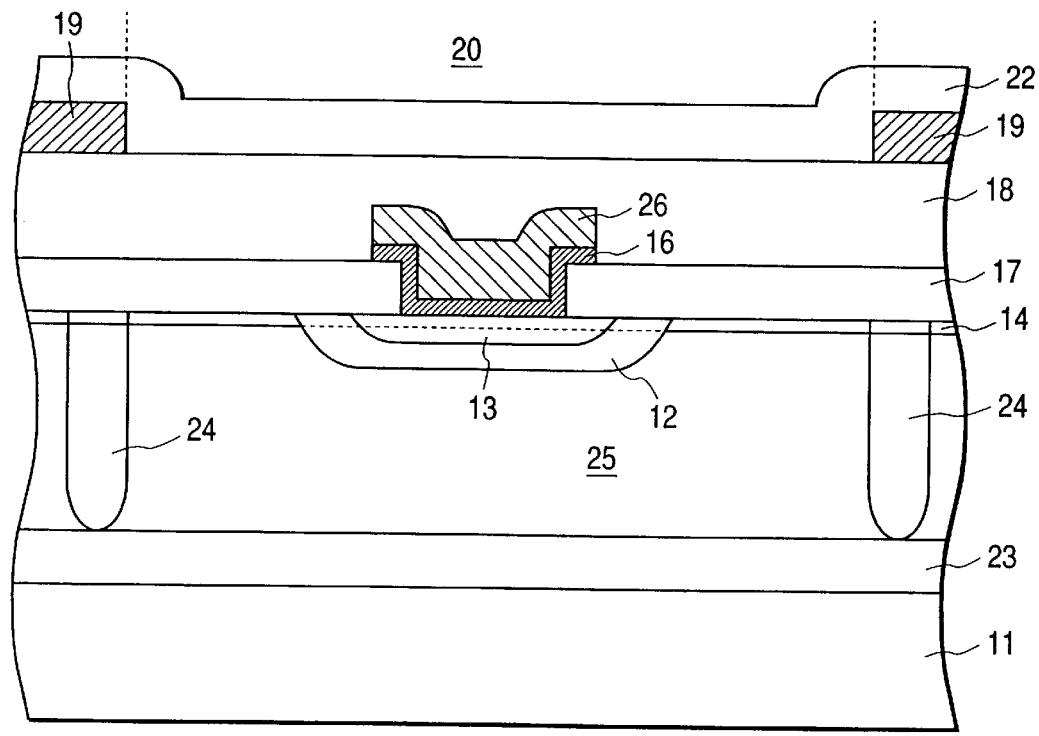
FIG. 16 is a sectional view showing the structure taken along a line 16—16 in FIG. 15 of the present invention.

FIG. 15 is a plan view showing the structure for one pixel according to the sixth embodiment of the present invention, and FIG. 16 is a sectional view showing the structure taken along a line 16—16 in FIG. 15.

In this embodiment, an n-type buried layer 23 and n-type epitaxial layer 25 are formed on an n-type semiconductor substrate 11. The impurity concentration of the n-type semiconductor substrate 11 is about $10^{16}$ cm$^{-3}$, that of the n-type buried layer 23 is about $10^{18}$ cm$^{-3}$ at maximum, and that of the epitaxial layer is about $10^{15}$ cm$^{-3}$.

First p-type regions 12 (12', 12"), second p-type regions 13 (13', 13"), and first n-type region 14 are formed in the surface portion of the epitaxial layer 25. The impurity concentrations of these regions are respectively around $2\times10^{18}$ cm$^{-3}$ in the vicinity of the surface of the first p-type region, around $10^{20}$ cm$^{-3}$ in the vicinity of the surface of the second p-type region 13, and around $5\times10^{16}$ cm$^{-3}$ in the vicinity of the surface of the first n-type region 14. The junction depth of the first p-type region 12 is about 0.5 µm, and that of the second p-type region 13 is about 0.3 µm.

In this embodiment, the first n-type region 14 is formed by implanting an ion in the entire surface in a pixel.

Also, in this embodiment, heavily-doped second n-type regions 24 are formed in the vicinity of the edges of each opening 20. The impurity concentration of the second n-type region 24 is around $2\times10^{19}$ cm$^{-3}$ near the surface, and around $3\times10^{17}$ cm$^{-3}$ near the junction with the n-type buried layer 23.

Hence, in this embodiment, as the epitaxial layer 25 in the pixel is bounded by a region having an impurity concentration higher than that of the epitaxial layer 25, the photocarriers produced in a neutral region in the epitaxial layer 2 can be efficiently accumulated on the second p-type region 13. Hence, each second p-type region 13 is formed to have a small size and to reduce the junction capacitance, thus providing a structure suitable for high sensitivity.

A metal interconnect 16 that contacts the second p-type region 13 uses a two-layered structure of a Ti layer 16 and Al layer 26.

A transparent insulating layer 17 formed on the epitaxial layer 25 via the first n-type region 14 or the first and second p-type regions 12 and 13 has a two-layered structure of SiO$_2$ and BPSG, and a transparent insulating layer 18 uses an SiO layer. Also, a light-shielding layer 19 uses Al, and an SiN layer is formed as a protection layer 22 on the light-shielding layer 19. In this embodiment, the size of an opening 20 per pixel is around 80 µm×50 µm.

Furthermore, a sensor chip having a pixel pitch of 84.7 µm, and 234 pixels each having the above-mentioned arrangement was formed, and 11 sensor chips were mounted on a glass epoxy substrate to form a photoelectric conversion apparatus serving as an A4-size contact image sensor.

As disclosed in the prior art, upon comparison of dark currents between this embodiment and a case wherein no first p-type regions 12 as the characteristic feature of the present invention are formed, the dark currents measured in the present invention were about ⅒ those of the prior art.

In the fifth and sixth embodiments, an n-type semiconductor region 14 having a higher concentration than that of the substrate is formed on the n-type semiconductor substrate 11 but is not always required. However, by forming the n-type semiconductor region 14, dark currents can be reduced.

To restate, according to the first to fourth embodiments, since a plurality of pn junctions are formed in each opening and are electrically connected to each other, photocarriers are effectively accumulated and the capacitance of the accumulation portion can be reduced. Hence, the sensitivity of the photoelectric conversion apparatus can be improved as compared to the prior art, and very remarkable effects can be obtained.

According to the fifth and sixth embodiments, even when a normal silicon process using a barrier metal is applied to the photoelectric conversion apparatus, a high-performance photoelectric conversion apparatus that can reduce dark currents can be realized, thus providing tremendous effects.

Many widely different embodiments of the present invention may be constructed without departing from the spirit and scope of the present invention. It should be understood that the present invention is not limited to the specific embodiments described in the specification, except as defined in the appended claims.

What is claimed is:

1. A photoelectric conversion apparatus comprising:
   a light-receiving element including
      a region of a first conductivity type,
      a first semiconductor region of a second conductivity type, formed on a surface of said region of a first conductivity type, and
a light-shielding layer having an opening with an area larger than said first semiconductor region,
wherein said light-receiving element includes a plurality of first semiconductor regions equivalent to said first semiconductor region in a single opening, and said plurality of first semiconductor regions in the single opening are electrically connected to each other.

2. An apparatus according to claim 1, further comprising:
a second semiconductor region of the first conductivity type, which is formed on the surface of said region of the first conductivity type, and has an impurity concentration higher than said region of the first conductivity type.

3. An apparatus according to claim 1, wherein said first semiconductor region has an island shape.

4. An apparatus according to claim 1, wherein said first semiconductor region is electrically connected to charge-voltage conversion means.

5. An apparatus according to claim 1, wherein said first semiconductor region is electrically connected to a gate of a MOS transistor.

6. An apparatus according to claim 1, wherein a plurality of light-receiving elements equivalent to said light-receiving element are formed.

7. An apparatus according to claim 2, wherein a plurality of light-receiving elements equivalent to said light-receiving element are formed.

8. An image sensor formed by mounting a plurality of photoelectric conversion apparatuses of claim 6 on a circuit board.

9. An image sensor formed by mounting a plurality of photoelectric conversion apparatuses of claim 7 on a circuit board.

10. A sensor according to claim 8, wherein said first semiconductor region has an island shape.

11. A sensor according to claim 8, wherein said first semiconductor region is electrically connected to charge-voltage conversion means.

12. A sensor according to claim 8, wherein said first semiconductor region is electrically connected to a gate of a MOS transistor.

13. A photoelectric conversion apparatus comprising:
a light-receiving element including
a first region of a first conductivity type,
a second region of a second conductivity type, formed on a surface of said first region,
a third region of the second conductivity type, which is formed in said second region and has an impurity concentration higher than said second region,
a first conductive material electrically connected to said third region,
and
a light-shielding layer having an opening with an area larger than said second region.

14. An apparatus according to claim 13, further comprising:
a fourth region of the first conductivity type, which is formed on the surface of said first region, and has an impurity concentration higher than said first region.

15. An apparatus according to claim 13, further comprising a transparent insulating layer formed on said first conductive material, wherein said insulating layer includes:
a first transparent insulating layer formed on said first region and having a contact hole smaller than said third region; and a second transparent insulating layer formed on said first insulating layer and said first conductive material, and
said first conductive material is electrically connected to said third region via said contact hole.

16. An apparatus according to claim 14, further comprising a transparent insulating layer formed on said first conductive material, wherein said insulating layer includes:
a first transparent insulating layer formed on said first region and having a contact hole smaller than said third region; and
a second transparent insulating layer formed on said first insulating layer and said first conductive material, and
said first conductive material is electrically connected to said third region via said contact hole.

17. An apparatus according to claim 13, wherein the first conductivity type is n conductivity type, the second conductivity type is p conductivity type, and said first conductive material includes a material selected from the group consisting of titanium, tungsten, platinum, molybdenum, hafnium, and cobalt.

18. An apparatus according to claim 13, wherein a junction depth between said third and first regions is larger than a junction depth between said second and first regions.

19. An apparatus according to claim 13, wherein an impurity concentration of said first region is around $10^{14}$ to $10^{16}$ cm$^{-3}$,
an impurity concentration near a surface of said second region is around $10^{17}$ to $10^{19}$ cm$^{-3}$,
an impurity concentration near a surface of said third region is around $10^{19}$ to $10^{21}$ cm$^{-3}$, and
an impurity concentration near a surface of said second semiconductor region is around $10^{16}$ to $10^{18}$ cm$^{-3}$.

20. An apparatus according to claim 13, wherein a plurality of light-receiving elements equivalent to said light-receiving element are formed.

21. An apparatus according to claim 14, wherein a plurality of light-receiving elements equivalent to said light-receiving element are formed.

22. An apparatus according to claim 15, wherein a plurality of light-receiving elements equivalent to said light-receiving element are formed.

23. An image sensor formed by mounting a plurality of photoelectric conversion apparatuses of claim 20 on a circuit board.

24. A sensor according to claim 23, wherein the first conductivity type is n conductivity type, the second conductivity type is p conductivity type, and said first conductive material includes a material selected from the group consisting of titanium, tungsten, platinum, molybdenum, hafnium, and cobalt.

25. A sensor according to claim 23, wherein a junction depth between said third and first regions is larger than a junction depth between said second and first regions.

26. A sensor according to claim 23, wherein an impurity concentration of said first region is around $10^{14}$ to $10^{16}$ cm$^{-3}$,
an impurity concentration near a surface of said second region is around $10^{17}$ to $10^{19}$ cm$^{-3}$,
an impurity concentration near a surface of said third region is around $10^{19}$ to $10^{21}$ cm$^{-3}$, and
an impurity concentration near a surface of said second semiconductor region is around $10^{16}$ to $10^{18}$ cm$^{-3}$.

27. A photoelectric conversion apparatus comprising:
a light-receiving element including a region of a first conductivity type,
a plurality of first semiconductor regions of a second conductivity type, formed on a surface of said region of the first conductivity type, and
connection means for connecting said plurality of first semiconductor regions so that said plurality of first semiconductor regions and said region of the first conductivity type forms a plurality of photoelectric conversion portions which are electrically connected to each other in parallel so as to perform photoelectric conversion.

28. An apparatus according to claim 27, further comprising a light-shielding layer including an opening with an area larger than the first semiconductor region, wherein said plurality of first semiconductor regions are included in a single opening formed with said light-shielding layer.

29. An apparatus according to claim 27, wherein said connection means includes a conductive material.

30. An apparatus according to claim 29, wherein a signal accumulated in the first semiconductor region is output from said light-receiving element through said conductive material.

31. An apparatus according to claim 30, wherein said plurality of first semiconductor regions are connected to each other by said conductive material and the signal accumulated in the first semiconductor region is output form said light-receiving element through said conductive material.

* * * * *

UNITED STATES PATENT AND TRADEMARK OFFICE
CERTIFICATE OF CORRECTION

PATENT NO.    : 6,150,704
DATED         : November 21, 2000
INVENTOR(S)   : Hiraku Kozuka Page 1 of 4

It is certified that error appears in the above-identified patent and that said Letters Patent is hereby corrected as shown below:

Title page,
Item [56] REFERENCES CITED UNDER FOREIGN PATENT DOCUMENTS
Insert: -- 1-303752     12/1989     Japan.
         61-264758      11/1986     Japan.
         55-154784      12/1980     Japan. --

Column 1,
Line 8, "substrate," should read -- substrate --;
Line 12, "system," should read -- system --;
Line 16, "such" should read -- such a --;
Line 34, "such" should read -- such a --;
Line 36, "junction," should read -- junction --;
Line 58, "circuit," should read -- circuit --.

Column 2,
Line 4, "photocarriers, but" should read -- photocarriers. However, --;
Line 30, "development" should read -- the development --;
Line 31, "of" should read -- for --;
Line 34, "layer" should read -- layer, --;
Line 45, "regions," should read -- regions --;
Line 47, "interface," should read -- interface --;
Line 54, "of" should read -- for --;
Line 61, "portion," should read -- portion --;
Line 64, "currents," should read -- currents --.

Column 3,
Line 15, "conversion," should read -- conversion apparatuses, --.

Column 4,
Line 42, "invention," should read -- invention. --;
Line 43, "FIG. 1, and" should read -- FIG. 1. --;
Line 47, "taking as" should read -- using --;
Line 49, "substrate," should read -- substrate --;
Line 57, "opening," should read -- opening --.

UNITED STATES PATENT AND TRADEMARK OFFICE
CERTIFICATE OF CORRECTION

PATENT NO. : 6,150,704
DATED : November 21, 2000
INVENTOR(S) : Hiraku Kozuka

It is certified that error appears in the above-identified patent and that said Letters Patent is hereby corrected as shown below:

Column 5,
Line 6, "nect 2," should read -- nect 2 --;
Line 24, "layer 6," should read -- layer 6 --;
Line 27, "region," should read -- region --;
Line 34, "interconnect," should read -- interconnect --;
Line 37, "in case of" should read -- for --;
Line 43, "light," should read -- light --;
Line 50, "recombine," should read -- recombined, --;
Line 60, "invention," should read -- invention. --;
Line 62, "FIG. 5, and" should read -- FIG. 5. --;
Line 65, "pn functions" should read -- pn junctions --.

Column 6,
Line 18, "charge-voltage-converted" should read -- charge-voltage converted --;
Line 20, "234 pixels" should read -- 234 pixels, --;
Line 21, "21.8-cm" should read -- 21.8 cm --;
Line 40, "is" should read -- this is --;
Line 44, "invention," should read -- invention. --;
Line 46, "FIG. 8, and" should read -- FIG. 8. --;
Line 48, "seven," should read -- seven --.

Column 7,
Line 8, "158 pixels" should read -- 158 pixels, --;
Line 9, "22-cm" should read -- 22 cm --;
Line 14, "is" should read -- this is --;
Line 19, "invention," should read -- invention. --;
Line 20, "and" should be deleted;
Line 23, "pn functions" should read -- pn junctions --;
Line 36, "Al" should read -- an Al --;
Line 37, "layer 26," should read -- layer 26 --;
Line 49, "234 pixels" should read -- 234 pixels, --;
Line 61, "charge-voltage-converted" should read -- charge-voltage converted --.

Column 8,
Line 4, "is" should read -- this is --;
Line 10, "invention, and" should read -- invention. --;
Line 21, "12"," should read -- 12" --;
Line 62, "$10^{19}$ $cm^{-3}$," should read -- $10^{19}$ $cm^{-3}$ --.

UNITED STATES PATENT AND TRADEMARK OFFICE
CERTIFICATE OF CORRECTION

PATENT NO. : 6,150,704
DATED : November 21, 2000
INVENTOR(S) : Hiraku Kozuka

It is certified that error appears in the above-identified patent and that said Letters Patent is hereby corrected as shown below:

Column 9,
Line 27, "may" should read -- it may --;
Line 28, "A1," should read -- Al --;
Line 30, "8," should read -- 18, --;
Line 34, "metal," should read -- metal --;
Line 35, "materials," should read -- materials --;
Line 37, "in case of" should read -- for --;
Line 38, "equivalence." should read -- equivalent. --;
Line 46, "invention," should read -- invention. --;
Line 47, "and" should be deleted.
Line 60, "region, -around" should read -- region 12, around --;
Line 63, "0.5 µm," should read -- 0.5 µm --;

Column 10,
Line 4, "surface," should read -- surface --;
Line 9, "layer 2" should read -- layer 25 --;
Line 16, "Al" should read -- an Al --;
Line 26, "234 pixels" should read -- 234 pixels, --;
Line 27, "arrangement" should read -- arrangement, --;
Line 38, "11 but" should read -- 11, but it --;
Line 44, "accumulated" should read -- accumulated, --.

Column 11,
Line 9, "An" should read -- The --;
Line 15, "An" should read -- The --;
Line 17, "An" should read -- The --;
Line 20, "An" should read -- The --;
Line 23, "An" should read -- The --;
Line 26, "An" should read -- The --;
Line 30, "of claim 6" should read -- according to claim 6 --;
Line 33, "of claim 7" should read -- according to claim 7 --;
Line 35, "A" should read -- The image --;
Line 37, "A" should read -- The image --;
Line 40, "A" should read -- The image --;
Line 56, "An" should read -- The --;
Line 61, "An" should read -- The --.

UNITED STATES PATENT AND TRADEMARK OFFICE
CERTIFICATE OF CORRECTION

PATENT NO.    : 6,150,704
DATED         : November 21, 2000
INVENTOR(S)   : Hiraku Kozuka It is certified that error appears in the above-identified patent and that said Letters Patent is hereby corrected as shown below:

Column 12,
Line 5, "An" should read -- The --;
Line 16, "An" should read -- The --;
Line 22, "An" should read -- The --;
Line 25, "An" should read -- The --;
Line 32, "$10^{21}$ cm$^{-3}$, and" should read -- $10^{20}$ cm$^{-3}$. --;
Lines 34-35, Lines 34-35 should be deleted;
Line 36, "An" should read -- The --;
Line 39, "An" should read --The--;
Line 42, "An" should read -- The --;
Line 46, "of claim 20" should read -- according to claim 20 --;
Line 48, "A" should read -- The image --;
Line 54, "A" should read -- The image --;
Line 58, "A" should read -- The image --;
Line 64, "$10^{21}$ cm$^{-3}$, and" should read -- $10^{20}$ cm$^{-3}$. --;
Line 66-67, Lines 66-67 should be deleted.

Column 14,
Line 12, "form" should read -- from --.

Signed and Sealed this

Sixteenth Day of October, 2001

Attest:

NICHOLAS P. GODICI
Attesting Officer     Acting Director of the United States Patent and Trademark Office